United States Patent
Yeo

(10) Patent No.: US 9,412,837 B2
(45) Date of Patent: Aug. 9, 2016

(54) METHODS OF MANUFACTURING SEMICONDUCTOR DEVICES

(75) Inventor: In-Joon Yeo, Hwaseong-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 701 days.

(21) Appl. No.: 13/368,755

(22) Filed: Feb. 8, 2012

(65) Prior Publication Data

US 2012/0264286 A1 Oct. 18, 2012

(30) Foreign Application Priority Data

Apr. 18, 2011 (KR) .................. 10-2011-0035686

(51) Int. Cl.
*H01L 29/66* (2006.01)

(52) U.S. Cl.
CPC ........ *H01L 29/6653* (2013.01); *H01L 29/6656* (2013.01); *H01L 29/66545* (2013.01)

(58) Field of Classification Search
CPC ............ H01L 29/6656; H01L 29/6653; H01L 29/66545; H01L 21/823864
USPC .................. 438/303, 595, 230, 183, 182; 257/E21.64
See application file for complete search history.

(56) References Cited

U.S. PATENT DOCUMENTS

| 6,127,216 A * | 10/2000 | Yu ............... H01L 21/82345 257/E21.623 |
| 6,346,450 B1 * | 2/2002 | Deleonibus et al. .......... 438/305 |

FOREIGN PATENT DOCUMENTS

| JP | 2005-019892 | 1/2005 |
| JP | 2007-134432 | 5/2007 |
| KR | 1020020047510 | 6/2002 |

* cited by examiner

*Primary Examiner* — Brett Feeney
*Assistant Examiner* — Erik T Peterson
(74) *Attorney, Agent, or Firm* — Onello & Mello, LLP.

(57) ABSTRACT

In a method of manufacturing a semiconductor device, the method comprises: forming a dummy gate pattern on a substrate; and forming first spacers at side surfaces of the dummy gate pattern to expose upper portions of the side surfaces of the dummy gate pattern. Sacrificial film patterns are formed on regions of the upper portions of the side surfaces of the dummy gate pattern which are exposed by the first spacers. Second spacers are formed on the first spacers and the sacrificial film patterns. An interlayer insulating film is formed to cover the substrate, the second spacers and the dummy gate pattern. A top surface of the dummy gate pattern is exposed by planarizing the interlayer insulating film, and a trench is formed by removing the dummy gate pattern and the sacrificial film patterns.

16 Claims, 13 Drawing Sheets

METHODS OF MANUFACTURING SEMICONDUCTOR DEVICES

CROSS REFERENCE TO RELATED APPLICATIONS

This application claims priority from Korean Patent Application No. 10-2011-0035686 filed on Apr. 18, 2011 in the Korean Intellectual Property Office, the disclosure of which is incorporated herein by reference in its entirety.

BACKGROUND

1. Field

Embodiments of the present inventive concepts relate to a method of manufacturing a semiconductor device.

2. Description of the Related Art

In the formation of semiconductor transistor devices, it is becoming more common for metal gates to be employed than polysilicon gates, in order to improve device characteristics. Metal gates are commonly fabricated using a replacement metal gate process. The replacement metal gate process includes forming a trench by removing a dummy gate pattern and then forming a metal gate by filling the trench with a metal material.

With the demands for ever-increased integration of such devices, and with the corresponding reduction in the design rule, the resulting width of the upper region of the trench used for forming the metal gate is also reduced. As a result, an overhang may be formed in the upper region of the trench in the process of filling the trench with metal, resulting in the formation of void regions within the formed metal gate. Such void regions can have an adverse impact on device characteristics.

SUMMARY

Aspects of the present inventive concepts provide a method of manufacturing a semiconductor device in which a trench has a widened upper region. This may prevent the formation of a void within a metal gate.

However, aspects of the present inventive concepts are not thus restricted. The above and other aspects of the present inventive concepts will become more apparent to one of ordinary skill in the art to which the present inventive concepts pertain by referencing the detailed description given below. In one aspect, a method of manufacturing a semiconductor device, comprises: forming a dummy gate pattern on a substrate; forming first spacers at side surfaces of the dummy gate pattern to expose upper portions of the side surfaces of the dummy gate pattern; forming sacrificial film patterns on regions of the upper portions of the side surfaces of the dummy gate pattern which are exposed by the first spacers; forming second spacers on the first spacers and the sacrificial film patterns; forming an interlayer insulating film to cover the substrate, the second spacers and the dummy gate pattern; exposing a top surface of the dummy gate pattern by planarizing the interlayer insulating film; and forming a trench by removing the dummy gate pattern and the sacrificial film patterns.

In some embodiments, the first spacers comprise a first material, and the sacrificial film patterns comprise a second material having etch selectivity relative to the first material.

In some embodiments, a top portion of the trench has a width that is greater than a width of a lower portion of the trench having a vertical position that is lower than the top portion.

In some embodiments, forming the first spacers comprises: depositing a first nitride film on the substrate and the dummy gate pattern; depositing an oxide film on the first nitride film; forming dummy spacers at side surfaces of the dummy gate pattern by etching part of the oxide film; and forming the first spacers to expose upper portions of the side surfaces of the dummy gate pattern by etching part of the first nitride film using the dummy spacers as a mask, wherein top surfaces of the dummy spacers are located at a vertical position that is relatively lower than the top surface of the dummy gate pattern.

In some embodiments, the first spacers are substantially L-shaped in cross-section.

In some embodiments, the method further comprises forming a metal gate electrode by depositing metal to fill the trench, wherein a top surface of the metal gate electrode has a width that is greater than a lower portion thereof.

In some embodiments, removing the dummy gate pattern and the sacrificial film patterns comprises a first etching process for removing the dummy gate pattern and a second etching process for removing the sacrificial film patterns.

In some embodiments, the method further comprises forming a dummy gate insulating film pattern between the substrate and the dummy gate pattern, wherein the sacrificial film patterns and the dummy gate insulating film pattern are simultaneously removed by the second etching process.

In some embodiments, the sacrificial film patterns extend from upper side surfaces of the dummy gate pattern to a top surface of the substrate via outer surfaces of the first spacers.

In another aspect, a method of manufacturing a semiconductor device comprises: forming a dummy gate pattern on a substrate; forming first spacers in contact with lower side surfaces of the dummy gate pattern and forming sacrificial film patterns in contact with upper side surfaces of the dummy gate pattern; forming an interlayer insulating film to cover the dummy gate pattern, the first spacers and the sacrificial film patterns and to expose a top surface of the dummy gate pattern; and forming a trench by removing the dummy gate pattern and the sacrificial film patterns.

In some embodiments, the method further comprises forming second spacers at side surfaces of the dummy gate pattern in contact with the first spacers and the sacrificial film patterns after forming the sacrificial film patterns and before forming the interlayer insulating film.

In some embodiments, the first spacers comprise a first material, and the sacrificial film patterns comprise a second material having etch selectivity relative to the first material.

In some embodiments, removing the dummy gate pattern and the sacrificial film patterns comprises a first etching process for removing the dummy gate pattern and a second etching process for removing the sacrificial film patterns.

In some embodiments, the method further comprises forming a dummy gate insulating film pattern between the substrate and the dummy gate pattern, wherein the sacrificial film patterns and the dummy gate insulating film pattern are simultaneously removed by the second etching process.

In some embodiments, the sacrificial film patterns extend from upper side surfaces of the dummy gate pattern to a top surface of the substrate via outer surfaces of the first spacers.

In another aspect, a method of manufacturing a semiconductor device, comprises: forming a dummy gate pattern on a substrate; forming insulating patterns at lower portions of sidewalls of the dummy gate pattern, the insulating patterns being formed of a first material; forming sacrificial film patterns at upper portions of sidewalls of the dummy gate patterns, the sacrificial film patterns being formed of a second material having etch selectivity relative to the insulating patterns; and forming a trench in the insulating layer by removing the dummy gate pattern and by selectively removing the sacrificial film patterns while retaining the insulating patterns, so that the trench has an upper portion having a width that is greater than a width of a lower portion of the trench, the lower portion of the trench having a vertical position that is lower than the upper portion thereof.

In some embodiments, forming the insulating patterns comprises: forming a first film of the first material on the sidewalls of the dummy gate pattern and on the substrate; forming a third film of third material on the first film to cover the first film; etching the third film to form dummy spacers at the lower portions of the sidewalls of the dummy gate patterns; and etching the first film using the dummy spacers as an etch mask to form the insulating patterns at lower portions of sidewalls of the dummy gate pattern of the first material.

In some embodiments, forming the sacrificial film patterns comprises: forming a second film of the second material on exposed portions of the dummy gate pattern, including the upper sidewalls of the dummy gate pattern, with the insulating patterns covering the lower portions of the sidewalls of the dummy gate pattern.

In some embodiments, forming the second film of the second material includes controlling a resulting thickness of the sacrificial film patterns to thereby adjust the width of the resulting upper portion of the trench.

In some embodiments, forming a trench further comprises: forming an insulating interlayer film to cover the dummy gate pattern, the insulating patterns and sacrificial film patterns; and planarizing the insulating interlayer film to expose a top surface of the dummy gate pattern; and removing the dummy gate pattern to form the trench: and wherein the method further comprises forming a metal gate electrode in the trench by filling the trench with a metal material, wherein the gate electrode has an upper portion having a width that is greater than a width of a lower portion of the gate electrode, the lower portion of the gate electrode having a vertical position that is lower than the upper portion thereof.

BRIEF DESCRIPTION OF THE DRAWINGS

The above and other aspects and features of the present inventive concepts will become more apparent by describing in detail exemplary embodiments thereof with reference to the attached drawings, in which.

DETAILED DESCRIPTION OF EMBODIMENTS

Figure 1:
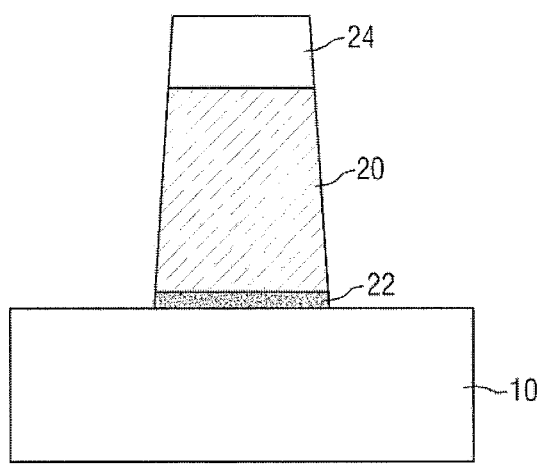
FIGS. 1 through 14 are cross-sectional views of a semiconductor device, for explaining a method of manufacturing a semiconductor device according to an exemplary embodiment of the present inventive concepts.

Embodiments of the present inventive concepts will now be described more fully hereinafter with reference to the accompanying drawings, in which embodiments are shown. This invention may, however, be embodied in different forms and should not be construed as limited to the embodiments set forth herein. Like numbers refer to like elements throughout the specification.

It will be understood that, although the terms "first", "second", etc. are used herein to describe various elements, these elements should not be limited by these terms. These terms are used to distinguish one element from another. For example, a "first" element could be termed a "second" element, and, similarly, a "second" element could be termed a "first" element, without departing from the scope of the present inventive concepts. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

In the specification, it will be understood that when a layer (or film) is referred to as being 'on' another layer or substrate, it can be directly on the other layer or substrate, or intervening layers may also be present. In the drawings, the dimensions of layers and regions are exaggerated for clarity of illustration. Also, though terms like a first, a second, and a third are used to describe various regions and layers in various embodiments of the present inventive concepts, the regions and the layers are not limited to these terms. These terms are used only to discriminate one region or layer from another region or layer. Therefore, a layer referred to as a first layer in one embodiment can be referred to as a second layer in another embodiment. An embodiment described and exemplified herein includes a complementary embodiment thereof. As used herein, the term 'and/or' includes any and all combinations of one or more of the associated listed items. Like reference numerals refer to like elements throughout.

A method of manufacturing a semiconductor device according to an exemplary embodiment of the present inventive concepts will now be described. FIGS. 1 through 14 are cross-sectional views of a semiconductor device, for explaining a method of manufacturing a semiconductor device according to an exemplary embodiment.

Referring to FIG. 1, a dummy gate pattern 20 is formed on a substrate 10. Specifically, a dummy gate insulating film pattern 22, the dummy gate pattern 20 and a hard mask pattern 24 may be sequentially stacked on the substrate 10. The dummy gate insulating film pattern 22 may be interposed between the substrate 10 and the dummy gate pattern 20, and the hard mask pattern 24 may be disposed on the dummy gate pattern 20.

The substrate 10 may be a bulk silicon substrate or a silicon-on-insulator (SOI) substrate, or other suitable substrate configuration. Alternatively, the substrate 10 may be a silicon substrate or a substrate comprised of another material such as germanium, indium antimonide, lead telluride, indium arsenide, indium phosphide, gallium arsenide, or gallium antimonide. However, the material that forms the substrate 10 is not limited to the above materials, and other suitable materials may be employed.

The dummy gate insulating film pattern 22 may comprise an oxide film such as a silicon oxide film. The dummy gate pattern 20 may comprise, for example, an amorphous carbon layer or polysilicon. The hard mask pattern 24 may comprise a nitride film such as SiN.

Figure 2:
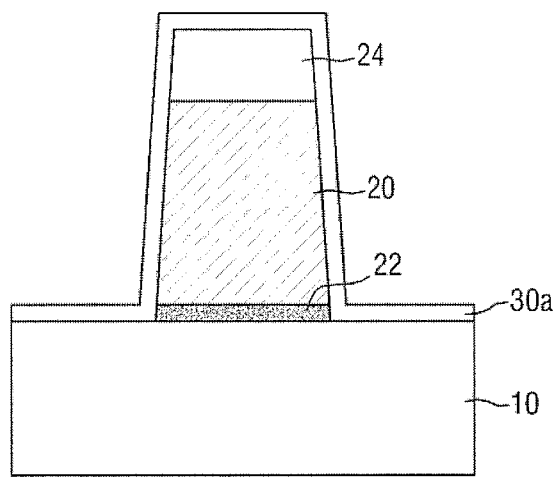

Referring to FIG. 2, a first nitride film 30a may be deposited on the substrate 10 and the dummy gate pattern 20.

The first nitride film 30a may comprise, for example, SiN. Alternatively, the first nitride film 30a may be conformally deposited on the substrate 10 and the above-described structure including the dummy gate insulating film pattern 22, the dummy gate pattern 20 and the hard mask pattern 24.

Figure 3:
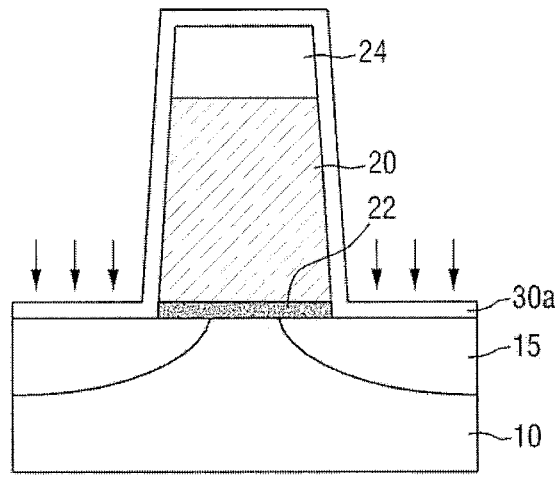

Referring to FIG. 3, source/drain regions 15 may be formed at side regions of the structure including the dummy gate pattern 20 by injecting N- or P-type impurities into the substrate 10.

Figure 4:
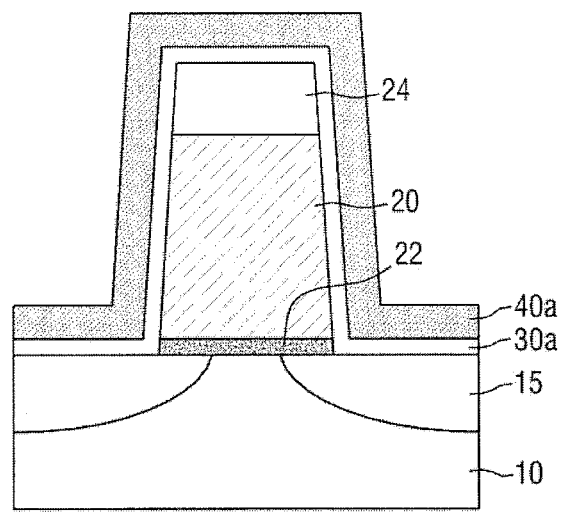

Referring to FIG. 4, a first oxide film 40a may be deposited on the first nitride film 30a. The first oxide film 40a may be deposited using an atomic layer deposition (ALD) process, for example; however, other suitable methods for forming the first oxide film 40a may be employed.

Figure 5:
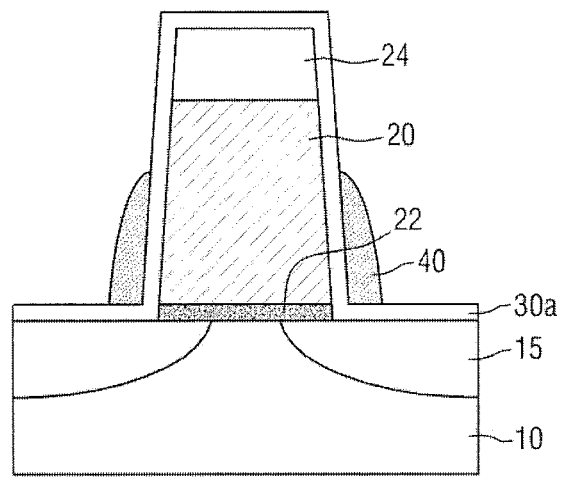

Referring to FIG. 5, dummy spacers 40 may be formed at side surfaces of the dummy gate pattern 20 by etching a portion of the first oxide film 40a. The first oxide film 40a may be dry-etched, for example, to form the dummy spacers 40. The geometry, including the thickness and height, of the resulting dummy spacers 40 can be controlled by managing the process parameters of the dry etch, or other process, in which the dummy spacers 40 are formed.

Figure 6:
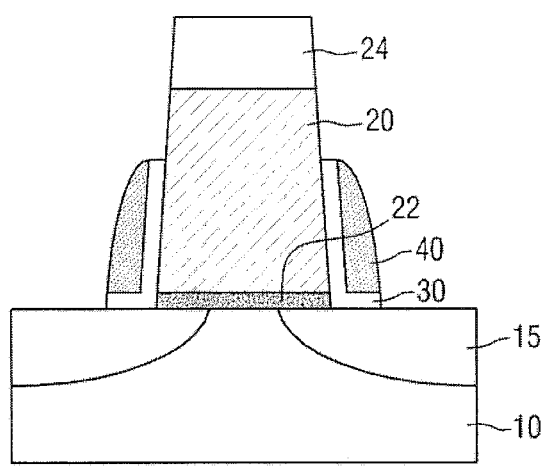

In a process to be described herein, portions of the first nitride film 30a are etched to form first spacers 30 (see FIG. 6). In this case, the dummy spacers 40 may be used as a mask for partially removing the first nitride film 30a. To form the first spacers 30 to expose part of the both side surfaces of the dummy gate pattern 20 by using the dummy spacers 40 as a mask, top portions of the dummy spacers 40 may be located at a vertical position that is relatively lower than a top surface of the dummy gate pattern 20.

Referring to FIG. 6, the first spacers 30 are formed at the side surfaces of the dummy gate pattern 20. The first spacers 30 expose upper portions of the both side surfaces of the dummy gate pattern 20. Portions of the first nitride film 30a are etched using the dummy spacers 40 as a mask, thereby forming the first spacers 30 which expose part of the both side surfaces of the dummy gate pattern 20. In particular, upper portions of the side surfaces of the dummy gate pattern are exposed in this step.

In some embodiments, the first nitride film 30a may be selectively etched using an etchant that contains $H_3PO_4$ or HF. For the etchant that contains $H_3PO_4$ or HF, the first nitride film 30a may have a higher etch selectivity than the oxide-containing dummy spacers 40. This difference in etch selectivity enables the dummy spacers 40 to be used as a mask for etching the first nitride film 30a.

As a result, regions of the first nitride film 30a which are not covered by the dummy spacers 40 may be etched, and regions of the first nitride film 30a which are not etched may become the first spacers 30. The first spacers 30 may be generally L-shaped spacers; however, the resulting shape of the first spacers 30 is not limited thereto.

In a process described herein, sacrificial film pattern 50 (see FIG. 8) are formed to be in contact with upper side surfaces of the dummy gate pattern 20. To this end, the upper side surfaces of the dummy gate pattern 20 need to be exposed. Thus, the first spacers 30 which expose portions of the upper side surfaces of the dummy gate pattern 20 may be formed by etching corresponding upper portions of the first nitride film 30a. For example, top surfaces of the first spacers 30 may be positioned at a vertical position that is relatively lower than the top surface of the dummy gate pattern 20.

Figure 7:
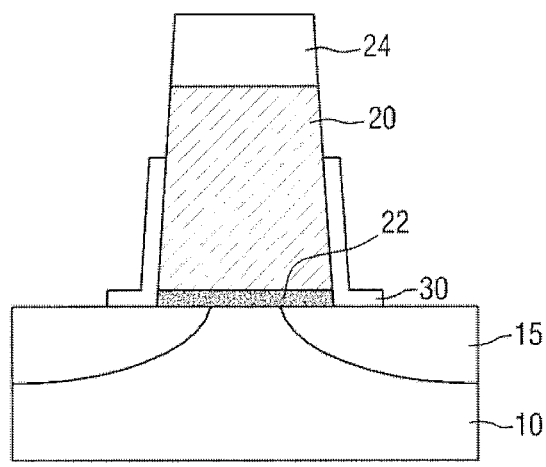

Referring to FIG. 7, the dummy spacers 40 may be removed. In particular, the dummy spacers 40 may be selectively removed to expose the first spacers 30. However, embodiments of the present inventive concepts are not limited thereto, and subsequent fabrication processes can be performed while the dummy spacers 40 remain wholly or partially in position next to the first spacers 30. Embodiments of a semiconductor manufacturing method in which the dummy spacers 40 are not removed will be described herein.

Figure 8:
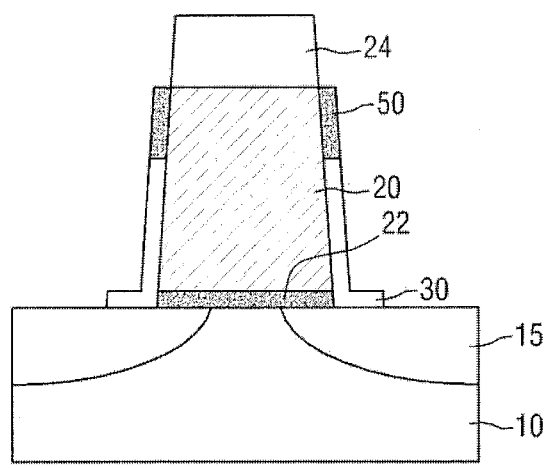

Referring to FIG. 8, sacrificial film patterns 50 are formed on regions of the exposed side surfaces of the dummy gate pattern 20 which are not covered by the first spacers 30.

The sacrificial film pattern 50 may include an oxide film such as a silicon oxide film. The sacrificial film pattern 50 may be formed using any of a number of suitable processes, including an oxygen diffusion process, a rapid thermal annealing (RTA) process, an oxygen ashing process, and a strip process using sulfuric acid or peroxide. Using the above processes, the sacrificial film pattern 50 can be formed on regions of upper portions of the side surfaces of the dummy gate pattern 20 which are exposed by the first spacers 30. In some embodiments, the sacrificial film pattern 50 are not formed on the first spacers 30 and the hard mask pattern 24. Although not shown in the drawing, as a result of the above processes for forming the sacrificial film pattern 50, the sacrificial film pattern 50 may also be formed on the substrate 10.

As a result, the first spacers 30 may be formed on the substrate 10 to be in contact with lower side surfaces of the dummy gate pattern 20, and the sacrificial film pattern 50 may be formed to be in contact with the upper side surfaces of the dummy gate pattern 20. However, embodiments of the present inventive concepts are not limited thereto, and the sacrificial film patterns 50 can also optionally be formed on the first spacers 30. Embodiments of a semiconductor manufacturing method in which the sacrificial film patterns 50 are also formed on the first spacers 30 will be described herein.

In a trench forming process to be described herein, a trench 80 (see FIG. 12) is formed by removing the dummy gate pattern 20. To increase a width of an upper region of the trench 80, the sacrificial pattern 50 which are in contact with the upper side surfaces of the dummy gate pattern 20 may also be removed. Accordingly, the width of the upper region of the trench 80 to be formed in a subsequent process can be adjusted by controlling the thickness of the applied sacrificial film pattern 50.

Figure 9:
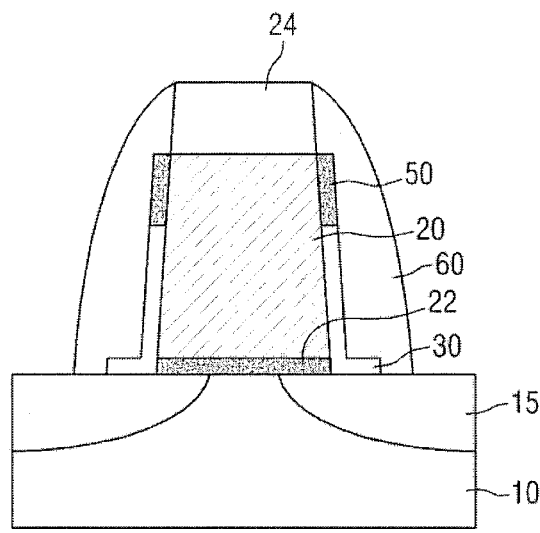

Referring to FIG. 9, second spacers 60 are formed on the first spacers 30 and the sacrificial film pattern 50. Specifically, the second spacers 60 are formed on the side surfaces of the dummy gate pattern 20, including the first spacers 30 and the sacrificial film pattern 50. The second spacers 60 may be in contact with the first spacers 30 and the sacrificial film pattern 50.

In some embodiments, the second spacers 60 may comprise a nitride such as SiN. However, embodiments of the present inventive concepts are not limited thereto. For example, the second spacers may comprise a material having etch selectivity relative to the sacrificial film pattern 50, and the first spacers 30.

Figure 10:
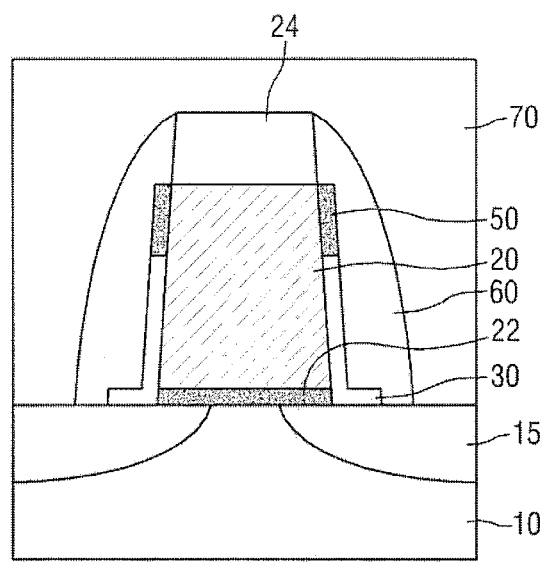

Referring to FIG. 10, an interlayer insulating film 70 is formed to cover the resulting structure, including the substrate 10, the second spacers 60 and the dummy gate pattern 20. In some embodiments, the interlayer insulating film 70 may contain silicon oxide, or other suitable insulative material.

Figure 11:
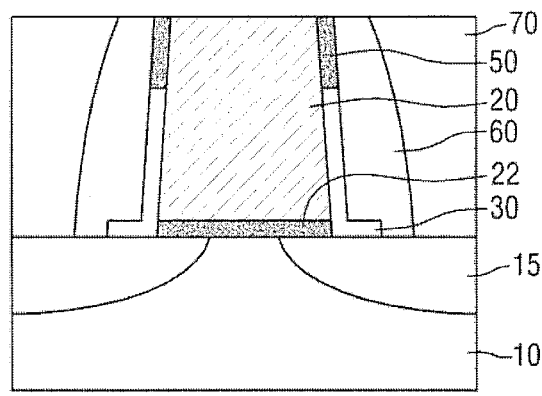

Referring to FIG. 11, the interlayer insulating film 70 is planarized to expose the top surface of the dummy gate pattern 20. Specifically, the hard mask pattern 24 and part of upper regions of the second spacers 60 may be removed in the process of planarizing the interlayer insulating film 70. In some embodiments, the planarizing of the interlayer insulating film 70 may be performed by a chemical mechanical polishing (CMP) process or an etch-back process, or by another suitable planarization process.

Figure 12:
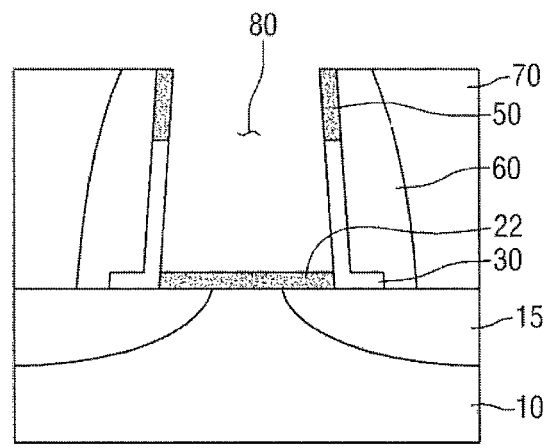
Figure 13:
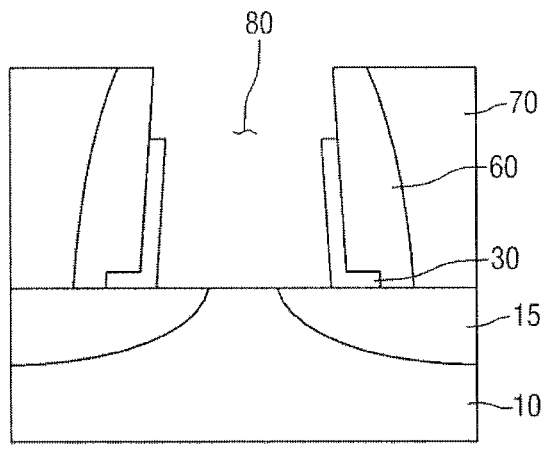

Referring to FIGS. 12 and 13, a trench 80 is formed by removing the dummy gate pattern 20 and the sacrificial film pattern 50. In some embodiments, the removing of the dummy gate pattern 20 and the sacrificial film pattern 50 may include a first etching process for removing the dummy gate pattern 20 and a second etching process for removing the sacrificial film patterns 50. In some embodiments, the first and second etching processes may be applied contemporaneously; in other embodiments, the first etching process for removing the dummy gate pattern 20 may be applied prior to the second etching process for removing the sacrificial film pattern 50.

Referring to FIG. 12, the first etching process may be, but is not limited to, a wet etching process. In the wet etching process, the dummy gate pattern 20 may be exposed to a hydroxide source-containing aqueous solution at a sufficiently high temperature for a sufficient period of time. As a result, the dummy gate pattern 20 may be substantially removed. The hydroxide source may contain, but not limited to, ammonium hydroxide or tetraalkylammonium hydroxide, for example, tetramethylammonium hydroxide (TMAH). When TMAH is used, the sacrificial film patterns 50 and the dummy gate insulating film pattern 22 may be etched by an insubstantial amount.

When the wet etching process is used, the dummy gate pattern 20 can also be substantially removed using an ammonium solution. The ammonium solution, by its nature, etches polysilicon at a quicker rate, while etching an oxide film very slowly. Thus, when the ammonium solution is used in the first etching process, the sacrificial film patterns 50 and the dummy gate insulating film pattern 22 may be etched minimally or insubstantially.

If the first etching process is performed using the ammonium solution at a high temperature of approximately 50° C., the dummy gate pattern 20, the sacrificial patterns 50 and the dummy gate insulating film pattern 22 can be removed simultaneously. Therefore, if the first etching process is performed at a high temperature by using the ammonium solution, the second etching process may be unnecessary.

The trench 80 may be formed by removing the dummy gate pattern 20 in the first etching process. Sidewalls of the trench 80 shown in FIG. 12 may have a negative profile. When a width of the trench 80 gradually increases from a top portion of the trench to a bottom portion of the trench, the sidewalls of the trench 80 have a slope that can be considered a negative slope.

Referring to FIG. 13, the second etching process may take the form of, but is not limited to, a wet etching process. In the wet etching process, for example, a HF-containing etchant may be employed.

As described above, the first spacers 30 may include a nitride film such as SiN, and the sacrificial film patterns 50 may include an oxide film such as a silicon oxide film. That is, the sacrificial film patterns 50 may comprise a material that is different from that of the first spacers 30, and therefore has etch selectivity with respect to the first spacers 30.

In some embodiments, a heat treatment process may be performed on the SiN-containing first spacers 30 before the second etching process is performed. As a result, the first spacers 30 may be etched minimally or insubstantially by the HF-containing etchant. That is, for an etching material used in the second etching process, the sacrificial film patterns 50 may have a relatively higher etch selectivity than the first spacers 30. Therefore, the sacrificial film patterns 50 and the dummy gate insulating film pattern 22 can be selectively and simultaneously removed while the shape of the first spacers 30 is substantially maintained.

The removal of the sacrificial film patterns 50 by the second etching process may allow the width of the upper region of the trench 80 to be increased by an amount that corresponds with the thickness of the removed sacrificial film patterns 50. As a result, a top surface of the trench 80 shown in FIG. 13 may have a width that is greater than a width of a bottom surface thereof, or may have a width that is greater than a width of a portion at a lower vertical position than the top portion thereof. The increased width of the upper region of the trench 80 can prevent a void from being created in the resulting gate during the later process of filling the trench 80 with metal.

In the method of manufacturing a semiconductor device according to the current exemplary embodiment, an additional process for removing the sacrificial film patterns 50 is not required. This is because the sacrificial film patterns 50 can be removed in the process of removing the dummy gate insulating film pattern 22. Alternatively, the sacrificial film patterns 50 can be removed in the process of removing the dummy gate pattern 20 using an ammonium solution at a high temperature.

Figure 14:
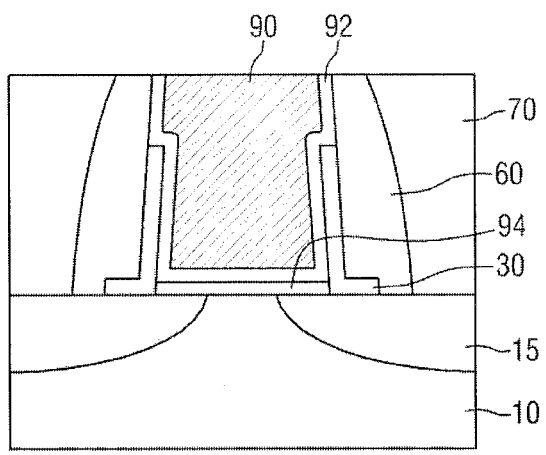

Referring to FIG. 14, metal is deposited to fill the trench 80, thereby forming a metal gate electrode 90.

A gate insulating film pattern 94 may be formed on the bottom surface of the trench 80. In some embodiments, the gate insulating film pattern 94 may comprise a high-k dielectric material (such as hafnium oxide) having a higher dielectric constant than that of silicon oxide. However, embodiments of the present inventive concepts are not limited thereto, and, for example, the gate insulating film pattern 94 can also comprise silicon oxide.

In some embodiments, a first barrier film (not shown) may be conformally deposited along a top surface of the interlayer insulating film 70 and the side and bottom surfaces of the trench 80. Then, metal (not shown) may be deposited to fill the trench 80 which has the first barrier film (not shown) conformally deposited thereon. The first barrier film (not shown) and the metal (not shown) may be planarized using the interlayer insulating film 70 as an etch stop layer, thereby forming a first barrier film pattern 92 and the metal gate electrode 90. In some embodiments, the first barrier film pattern 92 may contain, e.g., TiN, and the metal gate electrode 90 may contain, e.g., Al.

Since the width of the upper region of the trench 80 has been increased by removing the sacrificial film patterns 50, an overhang can be prevented from being formed in the upper region of the trench 80 during the process of depositing the metal (not shown) to fill the trench 80. Therefore, the trench 80 is filled with the metal (not shown) through the widened upper region of the trench 80, which, in turn, operates to prevent the formation of a void in the metal gate electrode 90.

Figure 15:
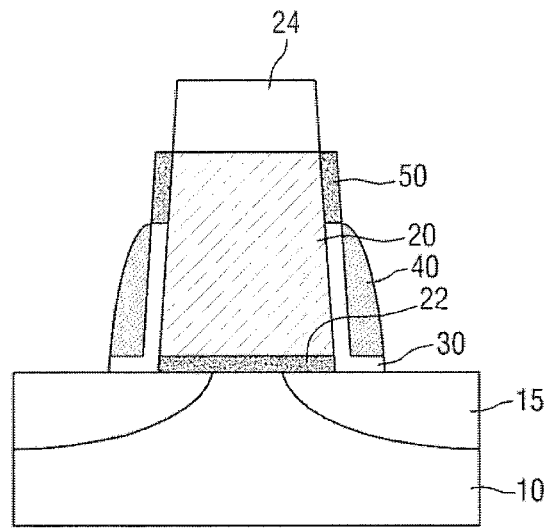
FIGS. 15 through 17 are cross-sectional views of a semiconductor device, for explaining a method of manufacturing a semiconductor device according to another exemplary embodiment of the present inventive concepts.
Figure 16:
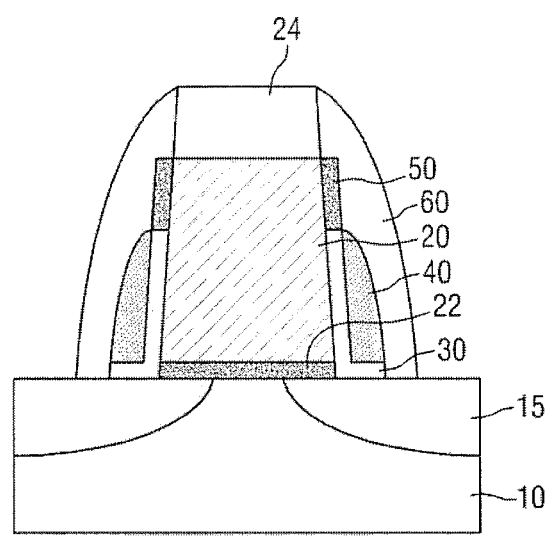
Figure 17:
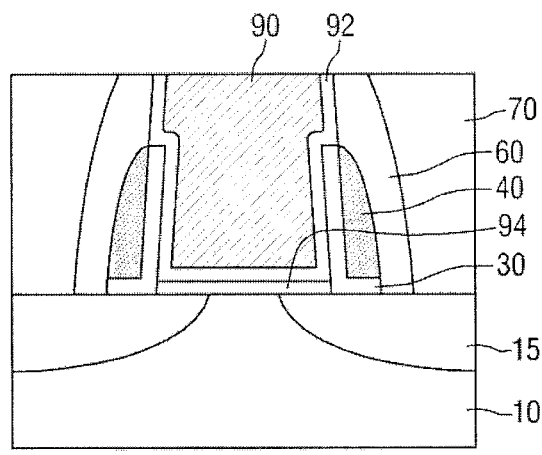

A method of manufacturing a semiconductor device according to another exemplary embodiment will be described with reference to FIGS. 1 through 6 and 15 through 17. The following description will focus on differences from the method of manufacturing a semiconductor device according to the previous exemplary embodiment of FIGS. 1 through 14. It will be apparent to those of ordinary skill in the art that the above description of the method of manufacturing a semiconductor device according to the previous exemplary embodiment of FIGS. 1 through 14 applies the same to the method of manufacturing a semiconductor device according to the current exemplary embodiment, except for the differences to be described below. FIGS. 15 through 17 are cross-sectional views of a semiconductor device, for explaining a method of manufacturing a semiconductor device according to another exemplary embodiment of the present inventive concepts.

Referring to FIGS. 1 through 6, a dummy gate insulating film pattern 22, a dummy gate pattern 20 and a hard mask pattern 24 are sequentially stacked on a substrate 10. Then, first spacers 30 are formed on side surfaces of the dummy gate pattern 20, and dummy spacers 40 are formed on the first spacers 30. A description of FIGS. 1 through 6 is the same as the description of the method of manufacturing a semiconductor device according to the previous exemplary embodiment of FIGS. 1 through 14.

Referring to FIG. 15, sacrificial film patterns 50 are formed on regions of the both side surfaces of the dummy gate pattern 20 which are exposed by the first spacers 30. In contrast with the method of manufacturing a semiconductor device according to the previous exemplary embodiment of FIGS. 1 through 14, in the method of manufacturing a semiconductor device according to the current exemplary embodiment, the sacrificial film pattern 50 is formed while the dummy spacers 40 remain.

The sacrificial film patterns 50 may include an oxide film such as a silicon oxide film. The sacrificial film patterns 50 may be formed by an oxygen diffusion process, an RTA process, an oxygen ashing process, and a strip process using sulfuric acid or peroxide, or by another suitable process. Using the above processes, the sacrificial film patterns 50 can be formed on the regions of the side surfaces of the dummy gate pattern 20 which are exposed by the first spacers 30. The sacrificial film patterns 50 are not formed on the dummy spacers 40 and the hard mask pattern 24. Although not shown in the drawing, when the above processes are used, the silicon oxide film may also be formed on exposed portions of the substrate 10.

Consequently, the first spacers 30 may be formed on the substrate 10 to be in contact with lower side surfaces of the dummy gate pattern 20, and the sacrificial film patterns 50 may be formed to be in contact with upper side surfaces of the dummy gate pattern 20. In addition, the dummy spacers 40 may be disposed on the first spacers 30.

Referring to FIG. 16, second spacers 60 are formed at the side surfaces of the dummy gate pattern 20 and on the first spacers 30, the dummy spacers 40 and the sacrificial film patterns 50. In some embodiments, the second spacers 60 may contain a nitride such as SiN. However, embodiments of the present inventive concepts are not limited thereto.

Referring to FIG. 17, an interlayer insulating film 70 may be formed to cover the dummy gate pattern 20, the dummy spacers 40 and the sacrificial film patterns 50 and to expose a top surface of the dummy gate pattern 20. Then, a trench 80 having a widened upper region may be formed by removing the sacrificial film patterns 50 and the dummy gate pattern 20. Metal (not shown) is deposited to fill the trench 80, thereby forming a metal gate electrode 90. A barrier film pattern 92 may optionally be provided, as described herein.

A method of manufacturing a semiconductor device according to another exemplary embodiment will now be described with reference to FIGS. 1 through 7 and 18 through 22. The following description will focus on differences from the method of manufacturing a semiconductor device according to the previous exemplary embodiment of FIGS. 1 through 14. It will be apparent to those of ordinary skill in the art that the above description of the method of manufacturing a semiconductor device according to the previous exemplary embodiment of FIGS. 1 through 14 applies the same to the method of manufacturing a semiconductor device according to the current exemplary embodiment, except for the differences to be described below. FIGS. 18 through 22 are cross-sectional views of a semiconductor device, for explaining a method of manufacturing a semiconductor device according to another exemplary embodiment of the present inventive concepts.

Referring to FIGS. 1 through 7, a dummy gate insulating film pattern 22, a dummy gate pattern 20 and a hard mask pattern 24 are sequentially stacked on a substrate 10, and first spacers 30 are formed on side surfaces of the dummy gate pattern 20. A description of FIGS. 1 through 7 is the same as the description of the method of manufacturing a semiconductor device according to the previous exemplary embodiment of FIGS. 1 through 14.

Figure 18:
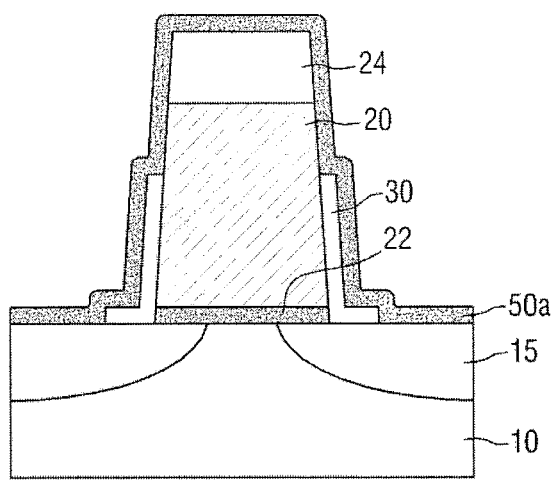
FIGS. 18 through 22 are cross-sectional views of a semiconductor device, for explaining a method of manufacturing a semiconductor device according to another exemplary embodiment of the present inventive concepts.

Referring to FIG. 18, a sacrificial film 50*a* may be formed on the substrate 10, the first spacers 30 and the dummy gate pattern 20.

Referring to FIG. 8, in the previous exemplary embodiment of FIGS. 1 through 14, the sacrificial film patterns 50 are locally formed on the regions of the both side surfaces of the dummy gate pattern 20 which are exposed by the first spacers 30. Unlike in the previous exemplary embodiment, in the method of manufacturing a semiconductor device according to the current exemplary embodiment, the sacrificial film 50*a* is formed on the substrate 10, the first spacers 30, the dummy gate pattern 20 and the hard mask pattern 24. Therefore, in the method of manufacturing a semiconductor device according to the current exemplary embodiment, the sacrificial film 50*a* may be formed not only on the regions of the side surfaces of the dummy gate pattern 20 which are exposed by the first spacers 30 but also on other regions of the resulting dummy gate pattern.

In some embodiments, the sacrificial film 50*a* may comprise an oxide film such as a silicon oxide film. The sacrificial film 50*a* may be deposited by, e.g., chemical vapor deposition (CVD) or plasma enhanced CVD (PECVD), or by another suitable process.

Figure 19:
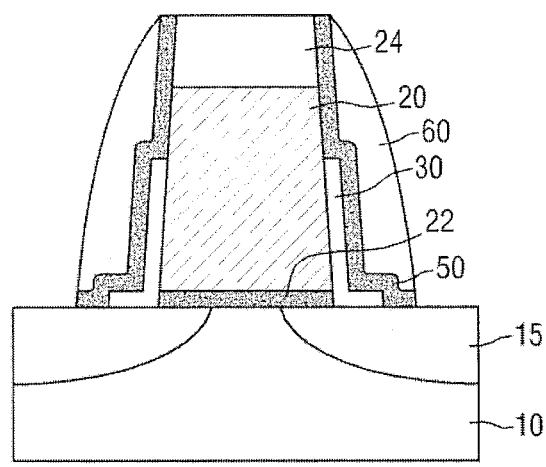

Referring to FIG. 19, second spacers 60 may be formed on the side surfaces of the dummy gate pattern 20 to cover the sacrificial film patterns 50.

Specifically, a material film (not shown) for forming the second spacers 60 may be deposited on the sacrificial film 50*a*. Then, the material film (not shown) may be patterned to form the second spacers 60. In the patterning of the material film (not shown), the sacrificial film 50a may also be patterned to form the sacrificial film patterns 50.

As a result, the sacrificial film patterns 50 may be formed on regions of the side surfaces of the dummy gate pattern 20 which are exposed by the first spacers 30. The sacrificial film patterns 50 may extend from upper side surfaces of the dummy gate pattern 20 to a top surface of the substrate 10 via top surfaces of the first spacers 30.

Figure 20:
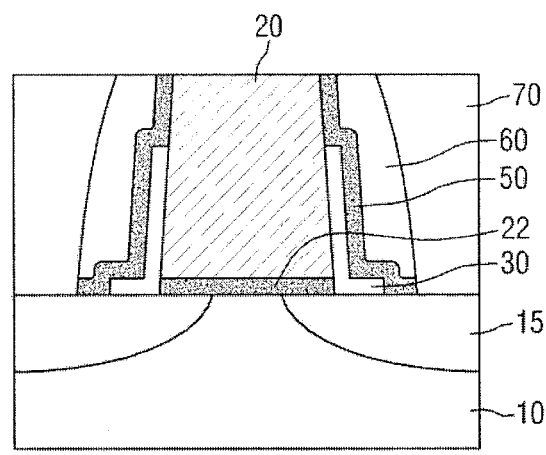

Referring to FIG. 20, an interlayer insulating film 70 may be formed to cover the dummy gate pattern 20, the sacrificial film patterns 50 and the second spacers 60. The resulting structure may be planarized to expose a top surface of the dummy gate pattern 20.

Figure 21:
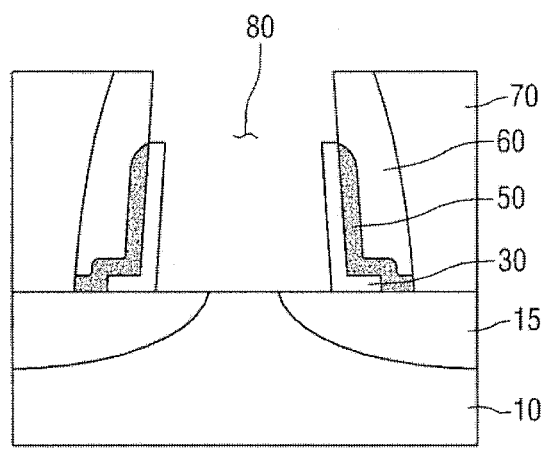

Referring to FIG. 21, a trench 80 having a widened upper region may be formed by removing the dummy gate pattern 20 and exposed portions of the sacrificial film pattern 50.

The operation of removing of the dummy gate pattern 20 and portions of the sacrificial film patterns 50 may include a first etching process for removing the dummy gate pattern 20 and a second etching process for removing part of the sacrificial film patterns 50. In the first etching process, the dummy gate pattern 20 may be removed to form the trench 80. In the second etching process, regions of the sacrificial film patterns 50 which are exposed by the first spacers 30 are removed to increase a width of the upper region of the trench 80. Alternatively, the dummy gate pattern 20 and the exposed portions of the sacrificial film patterns 50 may be removed simultaneously in the same processing step, for example in the manner described herein.

Figure 22:
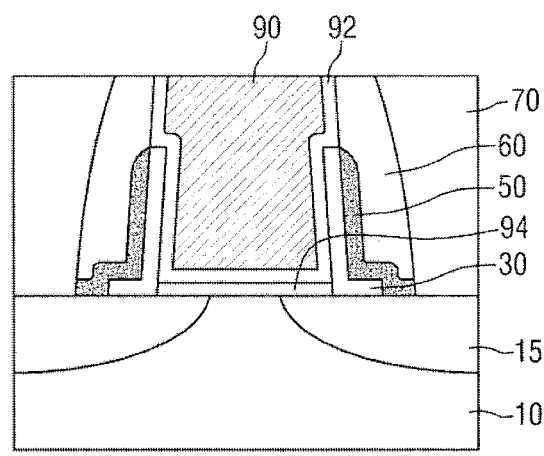

Referring to FIG. 22, metal (not shown) is deposited to fill the trench 80, thereby forming a metal gate electrode 90. A barrier film pattern 92 may optionally be provided, as described herein.

Figure 23:
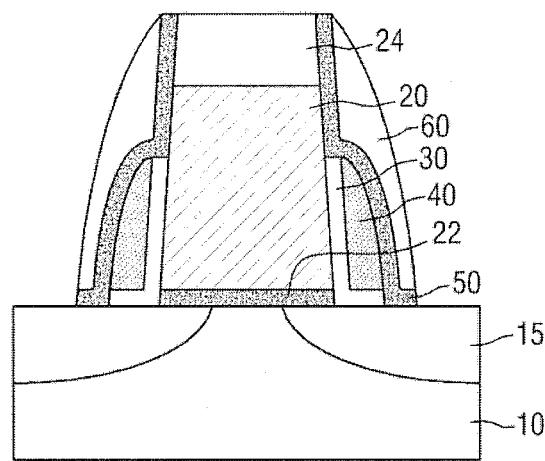
FIGS. 23 and 24 are cross-sectional views of a semiconductor device, for explaining a method of manufacturing a semiconductor device according to another exemplary embodiment of the present inventive concepts.
Figure 24:
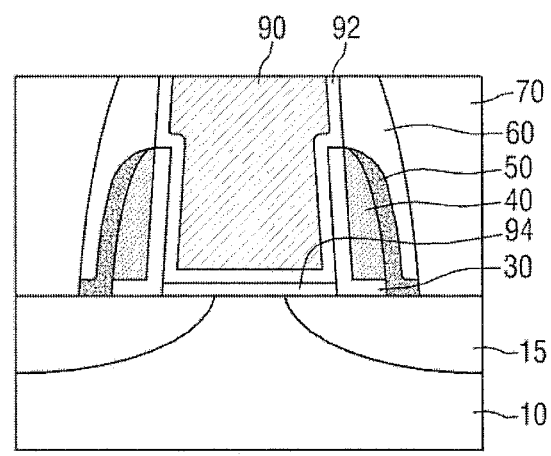

A method of manufacturing a semiconductor device according to another exemplary embodiment will now be described with reference to FIGS. 1 through 6, 23, and 24. The following description will focus on differences from the method of manufacturing a semiconductor device according to the previous exemplary embodiment of FIGS. 18 through 22. FIGS. 23 and 24 are cross-sectional views of a semiconductor device, for explaining a method of manufacturing a semiconductor device according to another exemplary embodiment of the present inventive concepts.

Referring to FIGS. 1 through 6, a dummy gate insulating film pattern 22, a dummy gate pattern 20 and a hard mask pattern 24 are sequentially stacked on a substrate 10. Then, first spacers 30 are formed on side surfaces of the dummy gate pattern 20, and dummy spacers 40 are formed on the first spacers 30.

Referring to FIG. 23, unlike in the previous exemplary embodiment of FIGS. 18 through 22, in the method of manufacturing a semiconductor device according to the current exemplary embodiment, sacrificial film patterns 50 are formed while the dummy spacers 40 remain in their positions at sidewalls of the first spacers 30. Therefore, the sacrificial film patterns 50 may additionally be formed on the still-present dummy spacers 40.

Referring to FIG. 24, a metal gate electrode 90 may be formed. A barrier film pattern 92 may optionally be provided, as described herein.

Figure 25:
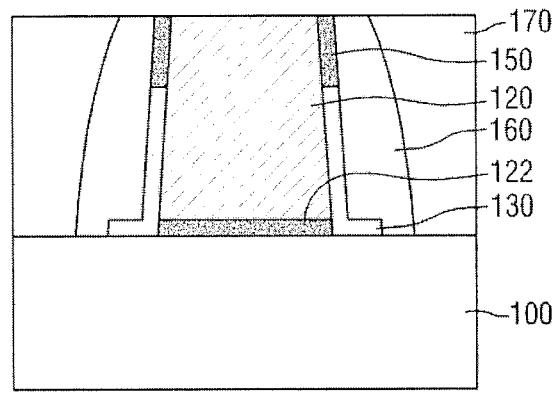
FIGS. 25 and 26 are cross-sectional views of a semiconductor device, for explaining a method of manufacturing a semiconductor device according to another exemplary embodiment of the present inventive concepts.
Figure 26:
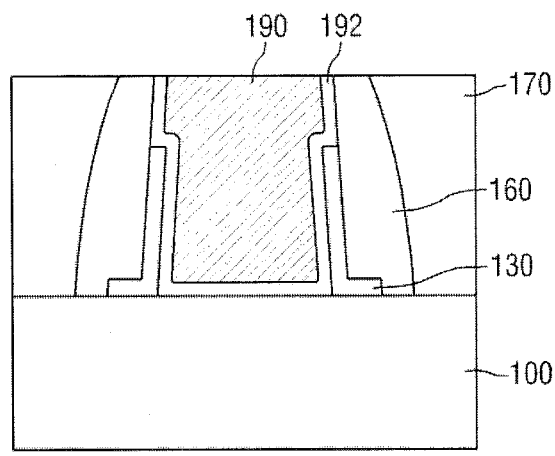

A method of manufacturing a semiconductor device according to another exemplary embodiment will be described with reference to FIGS. 25 and 26. The following description will focus on differences from the method of manufacturing a semiconductor device according to the previous exemplary embodiment of FIGS. 1 through 14. It will be apparent to those of ordinary skill in the art that the above description of the method of manufacturing a semiconductor device according to the previous exemplary embodiment of FIGS. 1 through 14 applies the same to the method of manufacturing a semiconductor device according to the current exemplary embodiment, except for the differences to be described below. FIGS. 25 and 26 are cross-sectional views of a semiconductor device, for explaining a method of manufacturing a semiconductor device according to another exemplary embodiment of the present inventive concepts.

Referring to FIG. 25, a dummy pattern 120 may be formed on a substrate 100, and first spacers 130 which are in contact with lower side surfaces of the dummy pattern 120 and sacrificial film patterns 150 which are in contact with upper side surfaces of the dummy pattern 120 may be formed. Then, an interlayer insulating film 170 may be formed to cover the dummy pattern 120, the first spacers 130 and the sacrificial film patterns 150 and to expose a top surface of the dummy pattern 120.

Referring to FIG. 26, a trench (not shown) having a widened upper region may be formed by removing the dummy pattern 120 and the sacrificial film patterns 150. After the formation of the trench, the trench (not shown) may be filled with metal (not shown), thereby forming a metal pattern 190. A barrier film pattern 192 may optionally be provided, as described herein.

The method of manufacturing a semiconductor device according to the current exemplary embodiment can be applied to form the metal pattern 190 for wiring. Since a width of the upper region of the trench (not shown) can be increased by removing the sacrificial film pattern 150, the formation of a void in the metal pattern 190 can be prevented.

While the present inventive concepts have been particularly shown and described with reference to exemplary embodiments thereof, it will be understood by those of ordinary skill in the art that various changes in form and details may be made therein without departing from the spirit and scope as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method of manufacturing a semiconductor device, the method comprising:
   forming a dummy gate pattern on a substrate;
   forming first spacers at side surfaces of the dummy gate pattern to expose upper portions of the side surfaces of the dummy gate pattern;
   forming sacrificial film patterns on regions of the upper portions of the side surfaces of the dummy gate pattern which are exposed by the first spacers, such that top surfaces of the sacrificial film patterns are level with a top surface of the dummy gate pattern;
   forming second spacers in contact with the first spacers and the sacrificial film patterns;
   forming an interlayer insulating film to cover the substrate, the second spacers and the dummy gate pattern;
   exposing the top surface of the dummy gate pattern by planarizing the interlayer insulating film; and
   forming a trench by removing the dummy gate pattern and the sacrificial film patterns.

2. The method of claim 1, wherein the first spacers comprise a first material, and the sacrificial film patterns comprise a second material having etch selectivity relative to the first material.

3. The method of claim 1, wherein a top portion of the trench has a width that is greater than a width of a lower portion of the trench having a vertical position that is lower than the top portion.

4. The method of claim 1, wherein forming the first spacers comprises:
    depositing a first nitride film on the substrate and the dummy gate pattern;
    depositing an oxide film on the first nitride film;
    forming dummy spacers at side surfaces of the dummy gate pattern by etching part of the oxide film; and
    forming the first spacers to expose upper portions of the side surfaces of the dummy gate pattern by etching part of the first nitride film using the dummy spacers as a mask,
    wherein top surfaces of the dummy spacers are located at a vertical position that is relatively lower than the top surface of the dummy gate pattern.

5. The method of claim 4, wherein the first spacers are substantially L-shaped in cross-section.

6. The method of claim 1, further comprising forming a metal gate electrode by depositing metal to fill the trench, wherein a top surface of the metal gate electrode has a width that is greater than a lower portion thereof.

7. The method of claim 1, wherein removing the dummy gate pattern and the sacrificial film patterns comprises a first etching process for removing the dummy gate pattern and a second etching process for removing the sacrificial film patterns.

8. The method of claim 7, further comprising forming a dummy gate insulating film pattern between the substrate and the dummy gate pattern, wherein the sacrificial film patterns and the dummy gate insulating film pattern are simultaneously removed by the second etching process.

9. A method of manufacturing a semiconductor device, the method comprising:
    forming a dummy gate pattern on a substrate;
    forming first spacers in contact with side surfaces of the dummy gate pattern and the substrate and forming sacrificial film patterns in contact with upper side surfaces of the dummy gate pattern such that top surfaces of the sacrificial film patterns are level with a top surface of the dummy gate pattern;
    forming an interlayer insulating film to cover the dummy gate pattern, the first spacers and the sacrificial film patterns and to expose the top surface of the dummy gate pattern;
    forming a trench by removing the dummy gate pattern and the sacrificial film patterns; and
    forming second spacers at side surfaces of the dummy gate pattern in contact with the first spacers and the sacrificial film patterns after forming the sacrificial film patterns and before forming the interlayer insulating film.

10. The method of claim 9, wherein the first spacers comprise a first material, and the sacrificial film patterns comprise a second material having etch selectivity relative to the first material.

11. The method of claim 9, wherein removing the dummy gate pattern and the sacrificial film patterns comprises a first etching process for removing the dummy gate pattern and a second etching process for removing the sacrificial film patterns.

12. The method of claim 11, further comprising forming a dummy gate insulating film pattern between the substrate and the dummy gate pattern, wherein the sacrificial film patterns and the dummy gate insulating film pattern are simultaneously removed by the second etching process.

13. A method of manufacturing a semiconductor device, comprising:
    forming a dummy gate pattern on a substrate;
    forming insulating patterns in contact with portions of sidewalls of the dummy gate pattern and the substrate, the insulating patterns being formed of a first material;
    forming sacrificial film patterns at upper portions of sidewalls of the dummy gate patterns such that top surfaces of the sacrificial film patterns are level with a top surface of the dummy gate pattern, the sacrificial film patterns being formed of a second material having etch selectivity relative to the insulating patterns; and
    forming a trench in the insulating layer by removing the dummy gate pattern and by selectively removing the sacrificial film patterns while retaining the insulating patterns, so that the trench has an upper portion having a width that is greater than a width of a lower portion of the trench, the lower portion of the trench having a vertical position that is lower than the upper portion thereof;
    wherein forming the insulating patterns comprises:
    forming a first film of the first material on the sidewalls of the dummy gate pattern and on the substrate;
    forming a third film of third material on the first film to cover the first film;
    etching the third film to form dummy spacers at the lower portions of the sidewalls of the dummy gate patterns; and
    etching the first film using the dummy spacers as an etch mask to form the insulating patterns at lower portions of sidewalls of the dummy gate pattern of the first material.

14. The method of claim 13, wherein forming the sacrificial film patterns comprises:
    forming a second film of the second material on exposed portions of the dummy gate pattern, including the upper sidewalls of the dummy gate pattern, with the insulating patterns covering the lower portions of the sidewalls of the dummy gate pattern.

15. The method of claim 14, wherein the forming of the second film of the second material includes controlling a resulting thickness of the sacrificial film patterns to thereby adjust the width of the resulting upper portion of the trench.

16. The method of claim 13, wherein forming a trench further comprises:
    forming an insulating interlayer film to cover the dummy gate pattern, the insulating patterns and sacrificial film patterns; and
    planarizing the insulating interlayer film to expose a top surface of the dummy gate pattern; and
    removing the dummy gate pattern to form the trench:
    and wherein the method further comprises:
    forming a metal gate electrode in the trench by filling the trench with a metal material, wherein the gate electrode has an upper portion having a width that is greater than a width of a lower portion of the gate electrode, the lower portion of the gate electrode having a vertical position that is lower than the upper portion thereof.

* * * * *